US012349468B2

(12) United States Patent
Li et al.

(10) Patent No.: US 12,349,468 B2
(45) Date of Patent: Jul. 1, 2025

(54) ARRAY SUBSTRATE AND DISPLAY APPARATUS

(71) Applicants: Beijing BOE Display Technology Co., Ltd., Beijing (CN); BOE Technology Group Co., Ltd., Beijing (CN)

(72) Inventors: Feng Li, Beijing (CN); Yu Ma, Beijing (CN); Yuqiong Chen, Beijing (CN); Na Wen, Beijing (CN); Qi Sang, Beijing (CN); Yan Yan, Beijing (CN); Jing Wang, Beijing (CN); Weitao Chen, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/642,709

(22) Filed: Apr. 22, 2024

(65) Prior Publication Data

US 2024/0321906 A1 Sep. 26, 2024

Related U.S. Application Data

(63) Continuation of application No. PCT/CN2023/082995, filed on Mar. 22, 2023.

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136286* (2013.01); *G02F 1/1368* (2013.01); *H10D 86/443* (2025.01)

(58) Field of Classification Search
CPC ............ G02F 1/1362; G02F 1/136286; G02F 1/1368; H10D 86/60; H10D 86/443; H10D 86/441
See application file for complete search history.

(56) References Cited

U.S. PATENT DOCUMENTS

2009/0103025 A1\* 4/2009 Tanno ............... G02F 1/134363
349/110
2009/0296037 A1\* 12/2009 Tanaka .............. G02F 1/134363
349/143

(Continued)

FOREIGN PATENT DOCUMENTS

CN 101592813 A 12/2009
CN 101750805 A 6/2010
(Continued)

*Primary Examiner* — Mariam Qureshi
(74) *Attorney, Agent, or Firm* — IPro, PLLC

(57) ABSTRACT

Disclosed are an array substrate and a display apparatus. The array substrate includes a base substrate; pixel circuits; gate lines; and pixel electrodes, where each pixel electrode includes a first end portion and a second end portion, intermediate portions connecting the first end portion and the second end portion, and a convex portion located on one side of the second end portion, the intermediate portions extend obliquely relative to both the first direction and the second direction, the convex portion extends in a direction at an obtuse angle to an extending direction of the intermediate portions, a slit between adjacent intermediate portions is a parallelogram, and an orthographic projection of the slit on the base substrate does not overlap with an orthographic projection of the pixel circuit on the base substrate and an orthographic projection of the gate line on the base substrate.

16 Claims, 12 Drawing Sheets

(51) Int. Cl.
    *G02F 1/1368*     (2006.01)
    *H10D 86/40*     (2025.01)

(56) References Cited

U.S. PATENT DOCUMENTS

| | | | |
|---|---|---|---|
| 2010/0002162 A1* | 1/2010 | Morimoto | G02F 1/134363 |
| | | | 349/38 |
| 2011/0109862 A1 | 5/2011 | Harada et al. | |
| 2016/0246132 A1* | 8/2016 | Cho | G02F 1/134309 |
| 2017/0168332 A1* | 6/2017 | Jeon | H01L 27/1222 |
| 2023/0296942 A1* | 9/2023 | Ren | G02F 1/13454 |
| | | | 349/56 |

FOREIGN PATENT DOCUMENTS

| | | |
|---|---|---|
| CN | 101893795 A | 11/2010 |
| CN | 105319785 A | 2/2016 |
| CN | 106918960 A | 7/2017 |
| CN | 111948855 A | 11/2020 |
| CN | 110134289 B | 5/2022 |
| JP | 2010008444 A | 1/2010 |
| JP | 2016126178 A | 7/2016 |
| JP | 2018055119 A | 4/2018 |
| WO | 2022120783 A1 | 6/2022 |

\* cited by examiner

1045

ARRAY SUBSTRATE AND DISPLAY APPARATUS

CROSS-REFERENCE TO RELATED APPLICATIONS

The application is a continuation application of International Application No. PCT/CN2023/082995, filed Mar. 22, 2023, which is hereby incorporated by reference in its entirety.

TECHNICAL FIELD

The present disclosure relates to the technical field of display, in particular to an array substrate and a display apparatus.

BACKGROUND

A thin film transistor liquid crystal display (TFT-LCD) has the characteristics of small size, low power consumption, high picture quality, no radiation, convenience in carrying, etc., has been developed rapidly in recent years, has gradually replaced a traditional cathode ray tube (CRT) display, and occupies a dominant position in the current flat panel display market. Currently, the TFT-LCD has been widely used in a variety of small, medium and large-sized products, covering almost all the major electronic products in today's information society, such as liquid crystal display TVs, high-definition digital TVs, computers (desktop and laptop), cell phones, tablet computers, navigators, in-vehicle displays, projection displays, camcorders, digital cameras, electronic watches, calculators, electronic instruments, meters, public displays, unreal displays, etc.

SUMMARY

The present disclosure provides an array substrate and a display apparatus. The specific solutions are as follows.

On the one hand, an array substrate provided by embodiments of the present disclosure includes:
 a base substrate;
 a plurality of pixel circuits, arranged in an array on the base substrate;
 a plurality of gate lines, extending in a first direction and arranged in a second direction on the base substrate, where the plurality of gate lines are coupled with the plurality of pixel circuits; and
 a plurality of pixel electrodes, arranged in an array on the base substrate, where each pixel electrode includes a first end portion and a second end portion arranged opposite to each other, a plurality of intermediate portions connecting the first end portion and the second end portion, and a convex portion located on one side of the second end portion, the first end portion is coupled with the pixel circuit, the intermediate portions extend obliquely relative to both the first direction and the second direction, the convex portion extends in a direction at an obtuse angle to an extending direction of the intermediate portions, a slit between adjacent intermediate portions is a parallelogram, and an orthographic projection of the slit on the base substrate does not overlap with an orthographic projection of the pixel circuit on the base substrate and an orthographic projection of the gate line on the base substrate.

In some embodiments, in the above array substrate provided by embodiments of the present disclosure, an orthographic projection of the convex portion on the base substrate approximates a triangle in shape, the triangle includes an arc angle far away from the second end portion, and an included angle of boundary extension lines of the arc angle is greater than or equal to 20° and less than or equal to 30°.

In some embodiments, in the above array substrate provided by embodiments of the present disclosure, an extending direction of the convex portion rotates the obtuse angle with respect to the extending direction of the intermediate portions; and the extending direction of the convex portion and the extending direction of the intermediate portions rotate in the same direction with respect to the first direction.

In some embodiments, in the above array substrate provided by embodiments of the present disclosure, the orthographic projection of the convex portion on the base substrate is located within the orthographic projection of the gate line on the base substrate.

In some embodiments, in the above array substrate provided by embodiments of the present disclosure, the pixel circuit includes a transistor, the transistor includes a station region for supporting a photo-spacer, and the orthographic projection of the convex portion on the base substrate and an orthographic projection of the station region on the base substrate do not overlap with each other.

In some embodiments, in the above array substrate provided by embodiments of the present disclosure, a first electrode of the transistor is coupled with the pixel electrode, two adjacent station regions in the second direction are staggered in the first direction, one of the two adjacent station regions overlaps with a region where the first electrode of the same transistor is located and a region where a second electrode of the same transistor is located, and the other of the two adjacent station regions overlaps with a region where a second electrode of one transistor is located and a region where the first electrode of a transistor adjacent with the one transistor is located.

In some embodiments, in the above array substrate provided by embodiments of the present disclosure, the array substrate further includes a plurality of data lines extending in inclination directions of the pixel electrodes and arranged in the first direction, line widths of the data lines are substantially uniform, and the data line is locally multiplexed as the second electrode of the transistor.

In some embodiments, in the above array substrate provided by embodiments of the present disclosure, the transistor is located on one side of the gate line facing the pixel electrode with which the gate line is coupled, a gate electrode of the transistor is arranged integrally with the gate line, and the gate electrode of the transistor is arranged at a corner far away from the gate line and the data line in a notched manner.

In some embodiments, in the above array substrate provided by embodiments of the present disclosure, an orthographic projection of an active layer of the transistor on the base substrate is located within orthographic projections of the gate electrode of the transistor and the gate line on the base substrate; and in the second direction, a bonding width between the active layer of the transistor and the second electrode of the transistor is greater than a bonding width between the active layer of the transistor and the first electrode of the transistor.

In some embodiments, in the above array substrate provided by embodiments of the present disclosure, an orthographic projection of one end of the convex portion far away from the second end portion on the base substrate is located within an orthographic projection of the data line on the base substrate.

In some embodiments, in the above array substrate provided by embodiments of the present disclosure, the plurality of pixel electrodes include a plurality of first pixel electrodes and a plurality of second pixel electrodes, rows where the first pixel electrodes are located and rows where the second pixel electrodes are located are alternately arranged in the second direction, and inclination directions of the intermediate portions of the first pixel electrodes and inclination directions of the intermediate portions of the second pixel electrodes are substantially symmetrical about the first direction.

On the other hand, the present disclosure provides a display apparatus, including an array substrate and an opposite substrate which are arranged opposite to each other, and a liquid crystal layer located between the array substrate and the opposite substrate, where the array substrate is the above array substrate provided by embodiments of the present disclosure.

In some embodiments, in the above display apparatus provided by embodiments of the present disclosure, pixel circuits include transistors, the transistors include station regions for supporting photo-spacers, the opposite substrate include the photo-spacers, and orthographic projections of end portions of the photo-spacers close to the array substrate on the base substrate and orthographic projections of the station regions on the base substrate substantially coincide.

DETAILED DESCRIPTION

Figure 1:
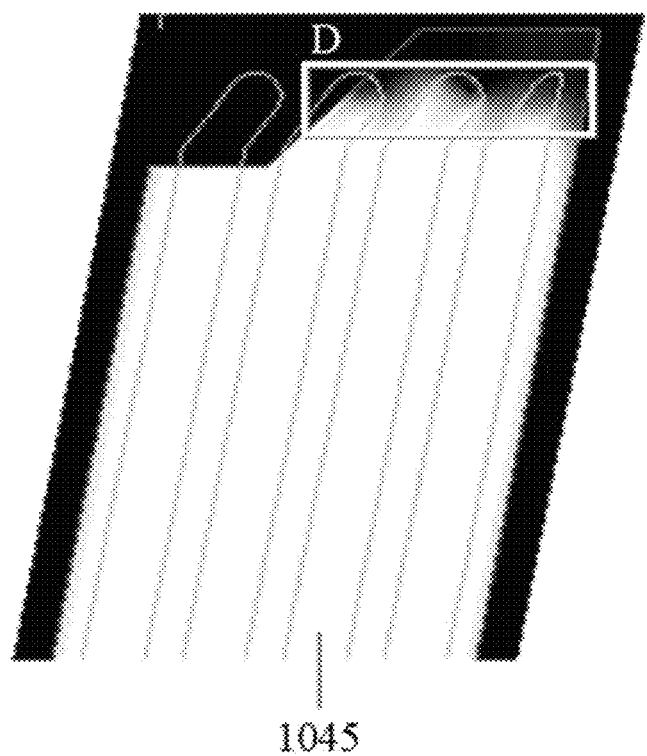
FIG. 1 is a simulation diagram of a light effect of sub-pixels in the related art.

In order to make the objectives, technical solutions and advantages of embodiments of the present disclosure clearer, the technical solutions of the embodiments of the present disclosure will be clearly and completely described below with reference to the accompanying drawings of the embodiments of the present disclosure. It needs to be noted that in order to make the objectives, technical solutions and advantages of the embodiments of the present disclosure clearer, the technical solutions of the embodiments of the present disclosure will be clearly and completely described below with reference to the accompanying drawings of the embodiments of the present disclosure. It needs to be noted that in the accompanying drawings, the thicknesses of layers, films, panels, regions, etc. are enlarged for clarity. Exemplary implementations are described in the present disclosure with reference to cross-sectional diagrams of schematic diagrams that serve as idealized implementations. In this way, deviations of results of, for example, manufacturing techniques and/or tolerances from the shapes of the figures will be expected. Thus, implementations described in the present disclosure should not be construed as being limited to the specific shape of a region as shown in the present disclosure, but rather include deviations in shape caused by, for example, manufacturing. For example, regions illustrated or described as flat may typically have rough and/or non-linear characteristics, and sharp corners illustrated may be rounded, etc. Thus, the regions shown in the figures are schematic in nature and their sizes and shapes are not intended to be the precise shapes of the illustrated regions; do not reflect the real scales and are intended only to schematically illustrate the content of the present disclosure. The same or similar reference numerals represent the same or similar elements or elements with the same or similar functions throughout. In order to keep the following descriptions of the embodiments of the present disclosure clear and concise, detailed descriptions of known functions and known components are omitted in the present disclosure.

Unless otherwise defined, technical or scientific terms used herein shall have the ordinary meanings understood by those ordinarily skilled in the art to which the present disclosure pertains. The words "first", "second" and the like used in the specification and claims of the present disclosure do not indicate any order, quantity or importance, but are only used to distinguish different components. The words "comprise" or "include" and the like indicate that an element or item appearing before the word covers listed elements or items appearing after the word and equivalents thereof, and does not exclude other elements or items. "Connecting", "connected", or other similar words are not limited to physical or mechanical connections, but may include electrical connections, whether direct or indirect. "Inner", "outer", "upper", "lower" and the like are only used to represent relative position relationships, and the relative position relationships may also change accordingly after an absolute position of a described object is changed.

In the following description, when an element or layer is said to be "on" or "connected to" another element or layer, the element or layer may be directly on another element or layer, or directly connected to another element or layer, or there may be an intermediate element or intermediate layer. When an element or layer is said to be "arranged on one side of" another element or layer, the element or layer may be directly on one side of another element or layer, or directly connected to another element or layer, or there may be an intermediate element or intermediate layer. However, when an element or layer is said to be "directly on" or "directly connected to" another element or layer, there is no intermediate element or intermediate layer. The term "and/or" includes any and all combinations of one or more relevant listed items.

Advanced dimension switch (ADS) liquid crystal display panels, with the advantages of high transmittance, wide viewing angle, etc., have been widely used in cell phones, tablet computers, desktop displays, TVs and other products.

The display principle of the ADS liquid crystal display panels is: by controlling the voltage between pixel electrodes and a common electrode, the rotation of liquid crystals is controlled, the transmittance of pixels is achieved, and finally the display of a target picture is achieved. In the conventional pixel design of the ADS liquid crystal display panels, in order to prevent Trace Mura, there are usually corner designs at the first and last ends of slits of the pixel electrodes, and corners have a poor light effect and affect the overall transmittance of the pixels, as shown in FIG. 1.

Figure 2:
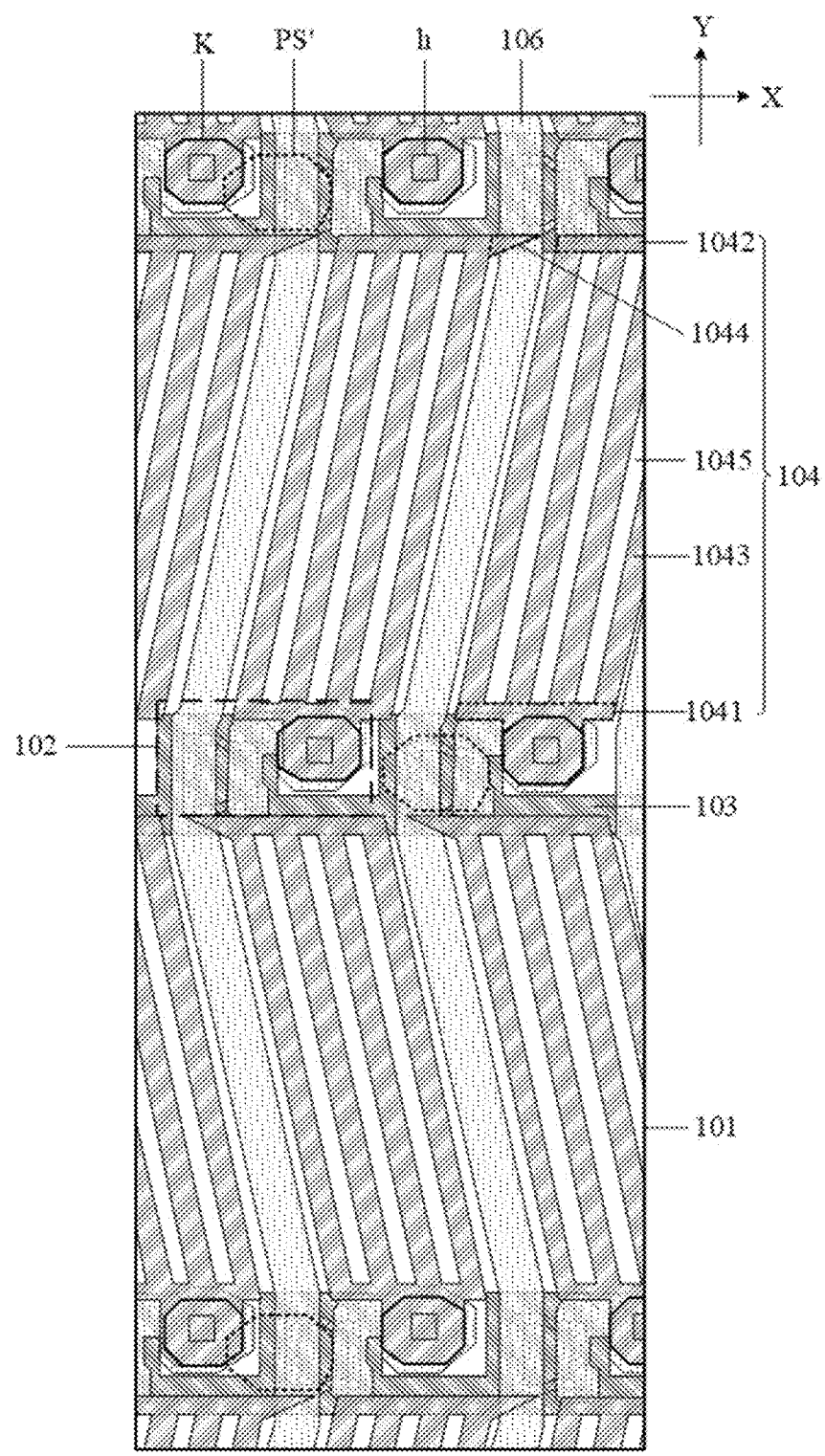
FIG. 2 is a schematic structural diagram of sub-pixels provided by an embodiment of the present disclosure.

In order to solve the above technical problems in the related art, embodiments of the present disclosure provide an array substrate, as shown in FIG. 2, including:

a base substrate 101, where the base substrate 101 is a substrate that allows visible light to pass through, for example, a material, such as glass, quartz, and plastic;

a plurality of pixel circuits (including transistors 102), arranged in an array on the base substrate 101, where the transistors 102 may be P-type transistors or N-type transistors, the transistors 102 may be bottom-gate transistors, top-gate transistors, or double-gate transistors, etc., and the transistors 102 may be amorphous silicon (a-Si) transistors, polycrystalline silicon (poly) transistors, oxide (such as indium gallium zinc oxide (IGZO)) transistors, and the like;

a plurality of gate lines 103, extending in a first direction X and arranged in a second direction Y on the base substrate 101, where the gate lines 103 are coupled with the pixel circuits (including the transistors 102), for example, the gate lines 103 are integrally arranged with gate electrodes 1021 of the transistors 102; and, the material of the gate lines 103 may include molybdenum (Mo), aluminum (Al), titanium (Ti), chromium (Cr), nickel (Ni) and other metals, and the gate lines 103 may be of a single-layer structure or a stacked-layer structure, for example, the gate lines 103 are of a single-layer structure composed of a molybdenum metal layer; and a plurality of pixel electrodes 104, arranged in an array on the base substrate 101, where each pixel electrode 104 includes a first end portion 1041 and a second end portion 1042 arranged opposite to each other, a plurality of intermediate portions 1043 connecting the first end portion 1041 and the second end portion 1042, and a convex portion 1044 located on one side of the second end portion 1042, the first end portion 1041 is coupled with the corresponding pixel circuit (including the transistor 102), for example, the first end portion 1041 is coupled with a first electrode 1022 of the transistor 102 through a via hole h penetrating through insulating layers, the intermediate portions 1043 extend obliquely relative to both the first direction X and the second direction Y, the convex portion 1044 extends in a direction at an obtuse angle α to an extending direction of the intermediate portions 1043, a slit 1045 between adjacent intermediate portions 1043 is a parallelogram, and an orthographic projection of each slit 1045 on the base substrate 101 does not overlap an orthographic projection of the corresponding pixel circuit (including the transistor 102) on the base substrate 101 and an orthographic projection of the corresponding gate line 103 on the base substrate 101; and optionally, the material of the pixel electrodes 104 includes a transparent conductive material, such as indium tin oxide (ITO), and indium zinc oxide (IZO).

Figure 3:
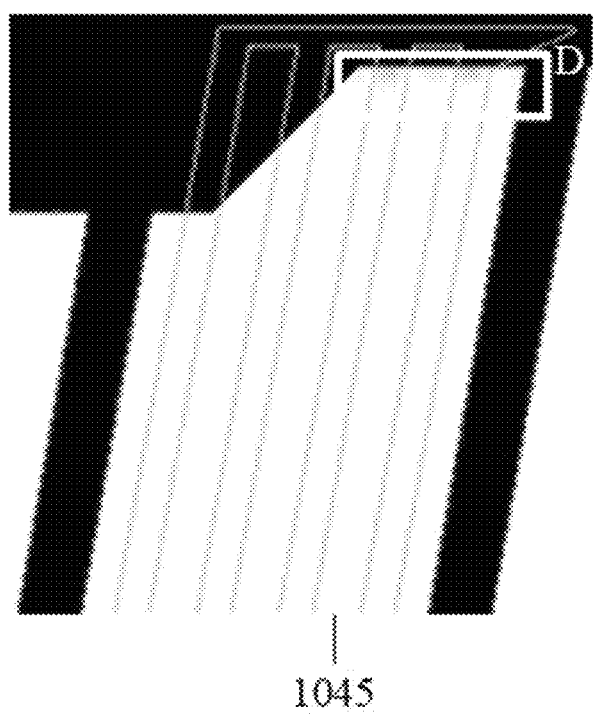
FIG. 3 is a simulation diagram of a light effect of sub-pixels provided by an embodiment of the present disclosure.
Figure 4:
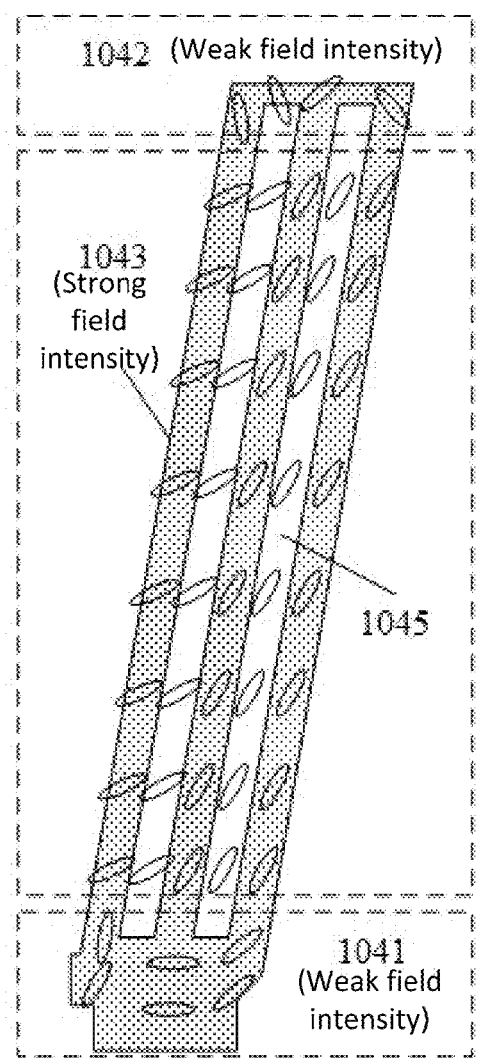
FIG. 4 is a schematic diagram of a liquid crystal molecule orientation when a pixel electrode has no convex portion provided by an embodiment of the present disclosure.

In the above array substrate provided by embodiments of the present disclosure, each slit 1045 of the pixel electrodes 104 is a parallelogram with no corner design, and it can be seen by comparing FIG. 1 and FIG. 3 that the slit 1045 of the present disclosure adopts no corner design, which can reduce a dark region D and effectively improve the transmittance. At the same time, the present disclosure provides that the orthographic projection of each slit 1045 on the base substrate 101 does not overlap the orthographic projection of the corresponding pixel circuit (including the transistor 102) on the base substrate 101 and the orthographic projection of the corresponding gate line 103 on the base substrate 101, which avoids the pixel circuit (including the transistor 102) and the gate line 103 from blocking light transmission at the slit 1045, and further improves the transmittance. However, as shown in FIG. 4, in a case that each slit 1045 adopts no corner design, liquid crystal molecules at the first end portion 1041 and the second end portion 1042 are oriented in a disordered manner, it is not easy to recover an original orientation in the absence of external force, and thus Trace Mura defects will occur. Based on this, according to the present disclosure, the convex portion 1044 with the obtuse angle α with the intermediate portions 1043 is arranged on one side of the second end portion 1042, and in combination with FIG. 5, it is seen that the convex portion 1044 can set a fixed molecular orientation for the liquid crystal molecules, preventing the liquid crystal molecules from not being able to recover in time after being pressed, and effectively preventing Trace Mura defects.

Figure 11:
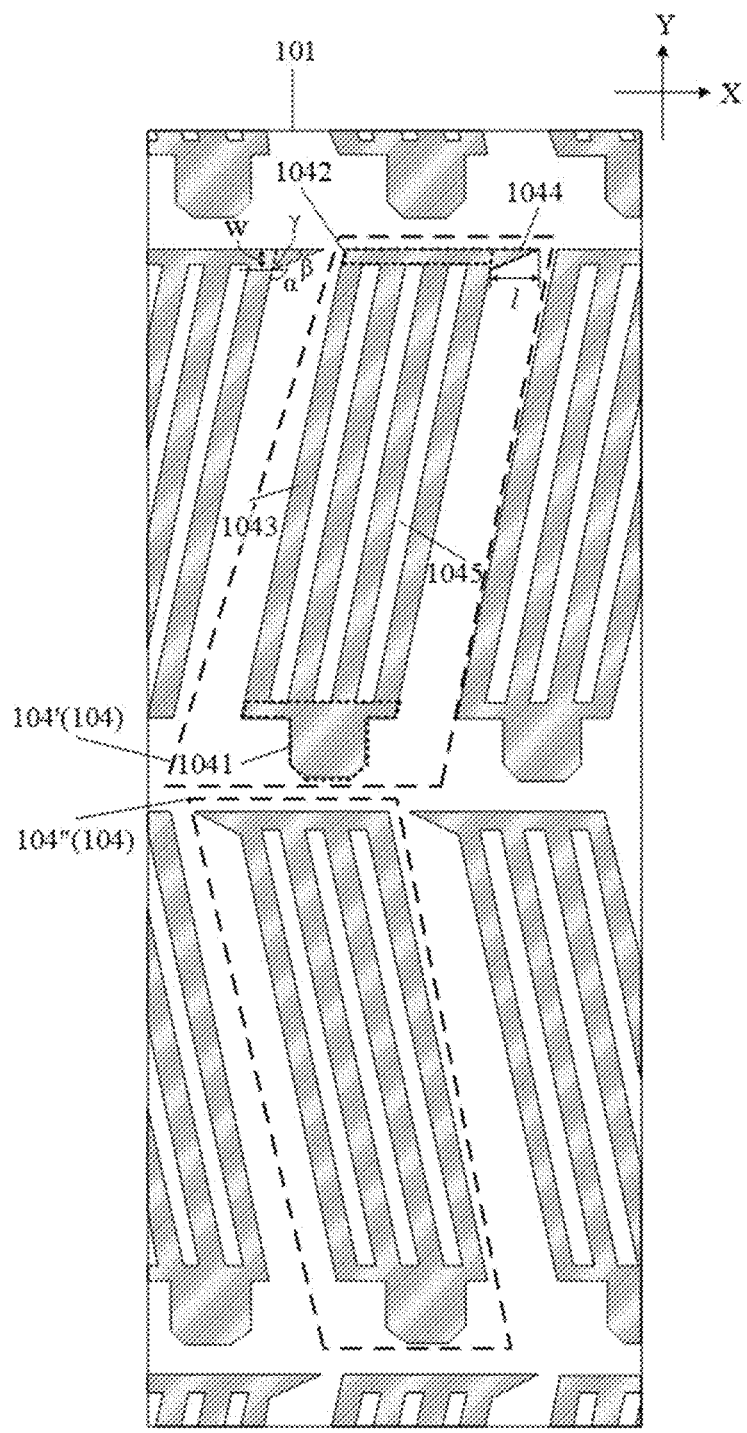
FIG. 11 is a schematic structural diagram of a layer where a pixel electrode is located in FIG. 2.

In some embodiments, in the above array substrate provided by embodiments of the present disclosure, as shown in FIG. 2 and FIG. 11, an orthographic projection shape of each convex portion 1044 on the base substrate 101 may be designed as a triangle, but due to the limitation of exposure accuracy and the like, an angle of the triangle away from the second end portion 1042 is actually made to be an arc angle rather than a sharp angle, so that the orthographic projection of each convex portion 1044 on the base substrate 101 in a final product approximates a triangle. To ensure the effect of each convex portion 1044 in fixing the orientation of the liquid crystal molecules, an included angle β of boundary extension lines of the arc angle may be set to be greater than or equal to 20° and less than or equal to 30°, for example, 20°, 21°, 22°, 23°, 24°, 25°, 26°, 27°, 28°, 29°, 30°, and the like. In some embodiments, in order to satisfy the requirement for resolution accuracy of an exposure machine, a length l of each convex portion 1044 may be set to be at least 3 μm, and accordingly, a width w of each convex portion 1044 is l*tan β. Continuing to refer to FIG. 11, it can be seen that the obtuse angle α, the included angle β, and an inclination angle γ of each intermediate portion 1043 satisfy the relationship equation: α=180°−γ+β.

In some embodiments, in the above array substrate provided by embodiments of the present disclosure, as shown in FIG. 2 and FIG. 11, the plurality of pixel electrodes 104 include a plurality of first pixel electrodes 104' and a plurality of second pixel electrodes 104", rows where the first pixel electrodes 104' are located and rows where the second pixel electrodes 104" are located are alternately arranged in the second direction Y, and inclination directions of the intermediate portions 1043 of the first pixel electrodes 104' and inclination directions of the intermediate portions of the second pixel electrodes 104" are substantially symmetrical (i.e., symmetrical or within a range of error due to factors such as fabrication, and measurement) about the first direction X, which enables the present disclosure to achieve a dual-category display effect and is conductive to improving the transmittance.

Figure 5:
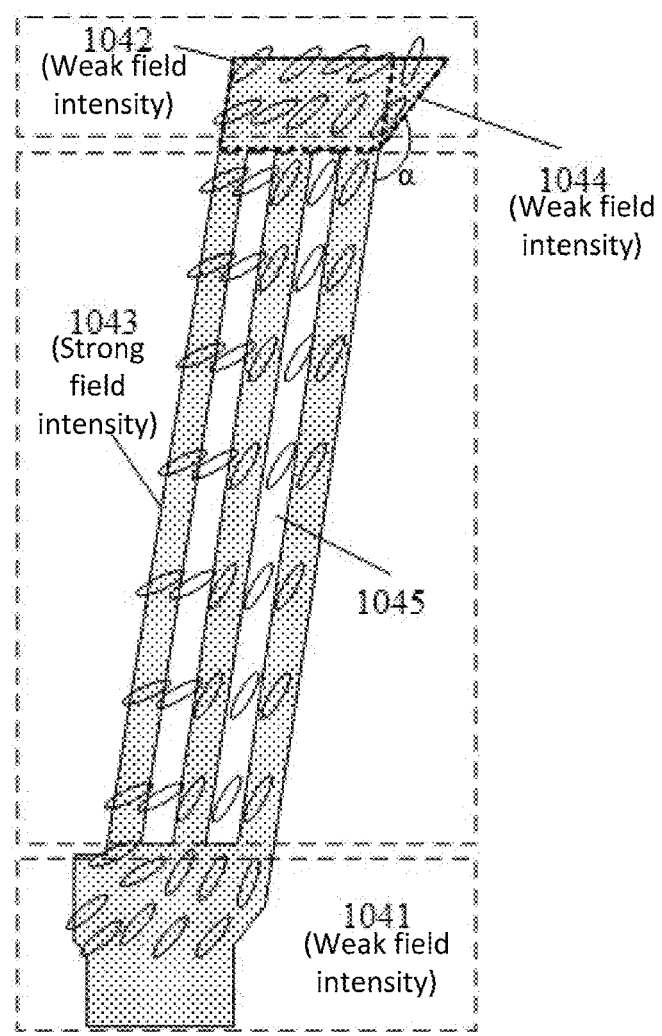
FIG. 5 is a schematic diagram of a liquid crystal molecule orientation when a pixel electrode has a convex portion provided by an embodiment of the present disclosure.

In some embodiments, as shown in FIG. 5, in a case that an extending direction of the convex portion 1044 rotates the obtuse angle α with respect to the extending direction of the intermediate portions 1043, and the extending direction of the convex portion 1044 and the extending direction of the intermediate portions 1043 rotate in the same direction with respect to the first direction X; the fixed molecular orientation can be set for the liquid crystal molecules, preventing the liquid crystal molecules from not being able to recover in time after being pressed, and effectively preventing the Trace Mura defects. Based on this, in order to effectively solve the Trace Mura defects, as shown in FIG. 2 and FIG. 11, in the present disclosure, the extending direction of the convex portion 1044 of each first pixel electrode 104' may be rotated the obtuse angle α with respect to the extending direction of the intermediate portions 1043 thereof, and the extending direction of the convex portion 1044 of each second pixel electrode 104" may be rotated the obtuse angle α with respect to the extending direction of the intermediate portions 1043 thereof. Exemplarily, FIG. 2 and FIG. 11 illustrate that the intermediate portions 1043 of each first pixel electrode 104' are inclined to the right, and accordingly, the convex portion 1044 of each first pixel electrode 104' is inclined to the right by the obtuse angle α with respect to the intermediate portions 1043 thereof; and the intermediate portions 1043 of each second pixel electrode 104" are inclined to the left, and accordingly, the convex portion 1044 of each second pixel electrode 104" is inclined to the left by the obtuse angle α with respect to the intermediate portions 1043 thereof.

Figure 6:
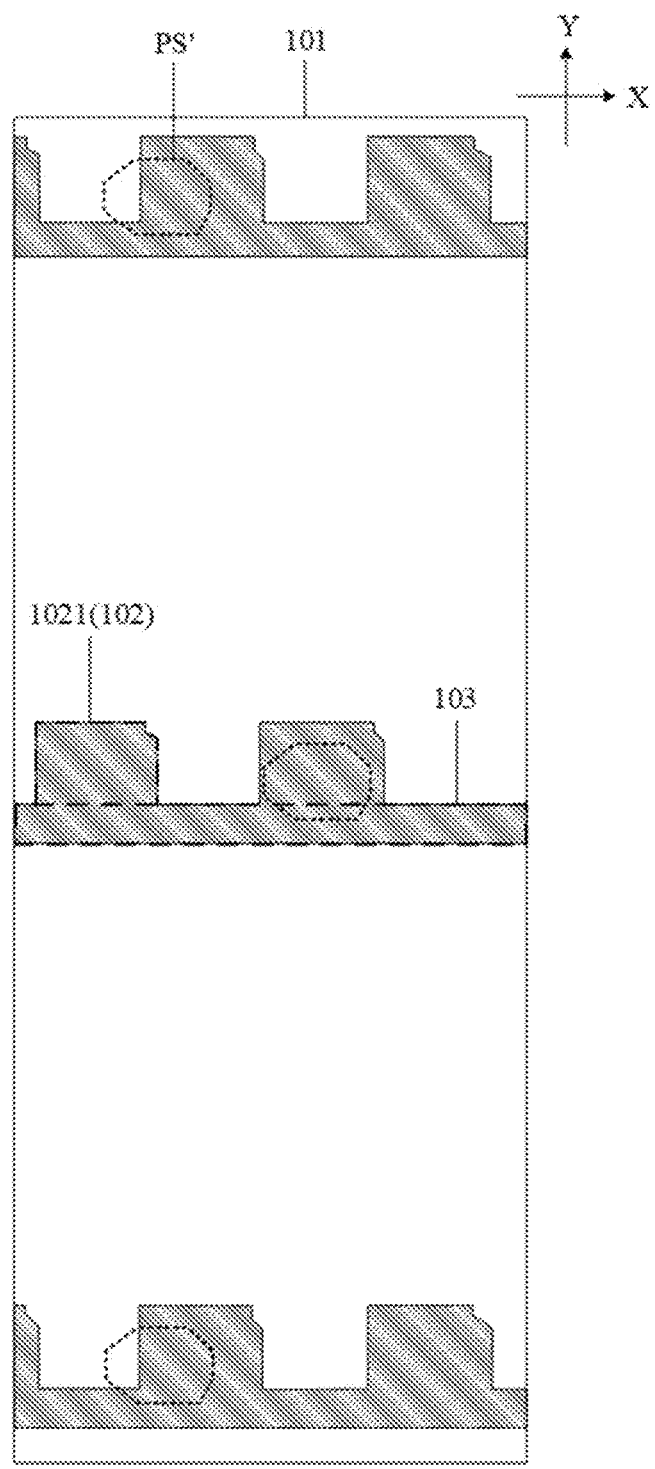
FIG. 6 is a schematic structural diagram of a layer where a gate line is located in FIG. 2.
Figure 7:
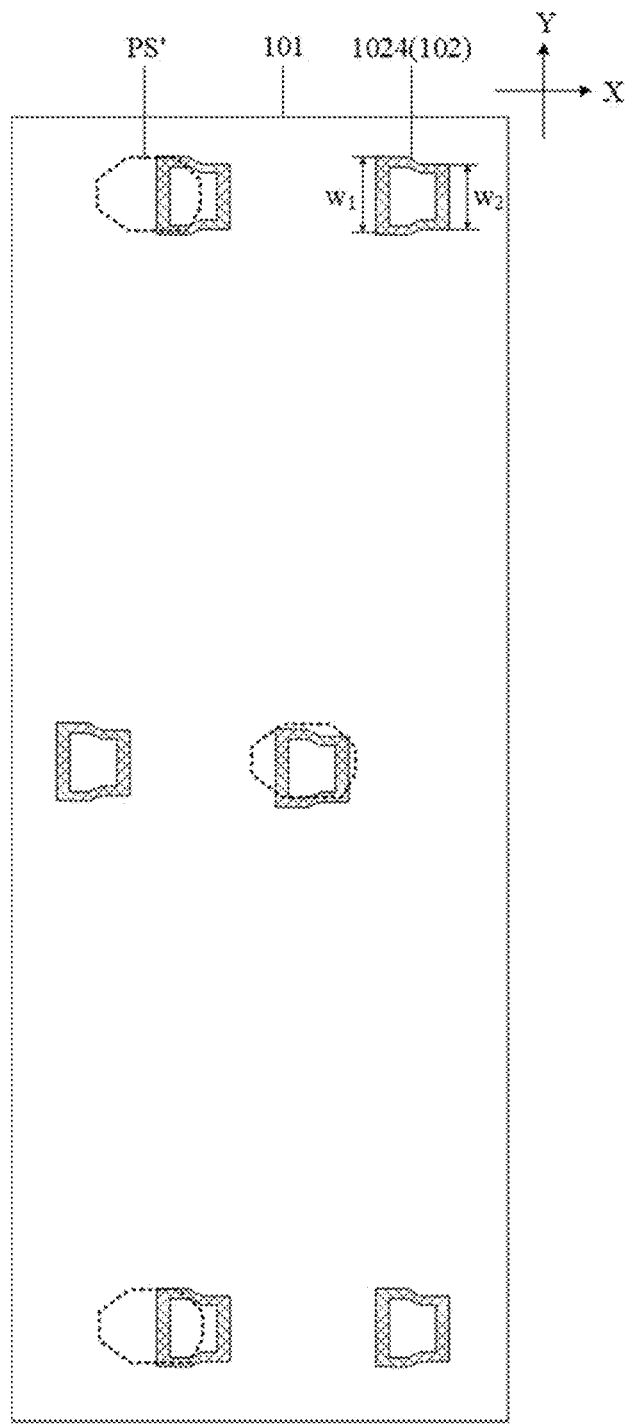
FIG. 7 is a schematic structural diagram of an active layer in FIG. 2.

In some embodiments, in the above array substrate provided by embodiments of the present disclosure, it can be seen from FIG. 2, FIG. 6 and FIG. 11 that the orthographic projection of each convex portion 1044 on the base substrate 101 may be located within the orthographic projection of the corresponding gate line 103 on the base substrate 101. Usually, black matrixes (BM) are used to shield the gate lines 103 in order to avoid reflection of the gate lines 103, and by disposing each convex portion 1044 in a region of the corresponding gate line 103, it is possible to make the convex portion 1044 and the gate line 103 share the black matrix (BM) without the need to additionally dispose the black matrix (BM) for shielding the convex portion 1044, and thus, the transmittance of the product is better.

In some embodiments, in the above array substrate provided by embodiments of the present disclosure, as shown in FIG. 2, and FIG. 6 to FIG. 8, each transistor 102 includes a station region PS' for supporting a photo-spacer (PS), and the orthographic projection of each convex portion 1044 on the base substrate 101 and an orthographic projection of the corresponding station region PS' on the base substrate 101 do not overlap, so that it is prevented that a film layer at the station region PS' is not flat to cause the poor orientation of an alignment layer and affect the liquid crystal recovery effect.

In some embodiments, in the above array substrate provided by embodiments of the present disclosure, as shown in FIG. 2 and FIG. 8 to FIG. 11, the first electrode 1022 of each transistor 102 is coupled with the corresponding pixel electrode 104, in some embodiments, the first electrode 1022 of each transistor 102 is coupled with the corresponding pixel electrode 104 by means of the via hole h penetrating through the insulating layers (e.g., including a passivation layer PVX located between a layer where the pixel electrodes 104 are located and a layer where a common electrode 105 is located, and a planarization layer PLN located between the layer where the common electrode 105 is located and a layer where the first electrode 1022 is located). Moreover, in order to avoid the common electrode 105 from short circuits with the first electrodes 1022 and the pixel electrodes 104, a hollowed-out structure K exposing the via hole h may be arranged on the common electrode 105. In some embodiments, the material of the common electrode 105 may include a transparent conductive material, such as indium tin oxide (ITO), and indium zinc oxide (IZO); the material of the passivation layer PVX includes, but is not limited to, an inorganic insulating material, such as silicon oxide, silicon nitride, and silicon oxynitride; and the material of the planarization layer PLN may be an organic insulating material, such as a polyacrylic acid resin, a polyepoxy acrylic acid resin, a light-sensitive polyimide resin, polyester acrylate, a polyurethane acrylate resin, and a phenolic epoxy acrylic resin.

Figure 8:
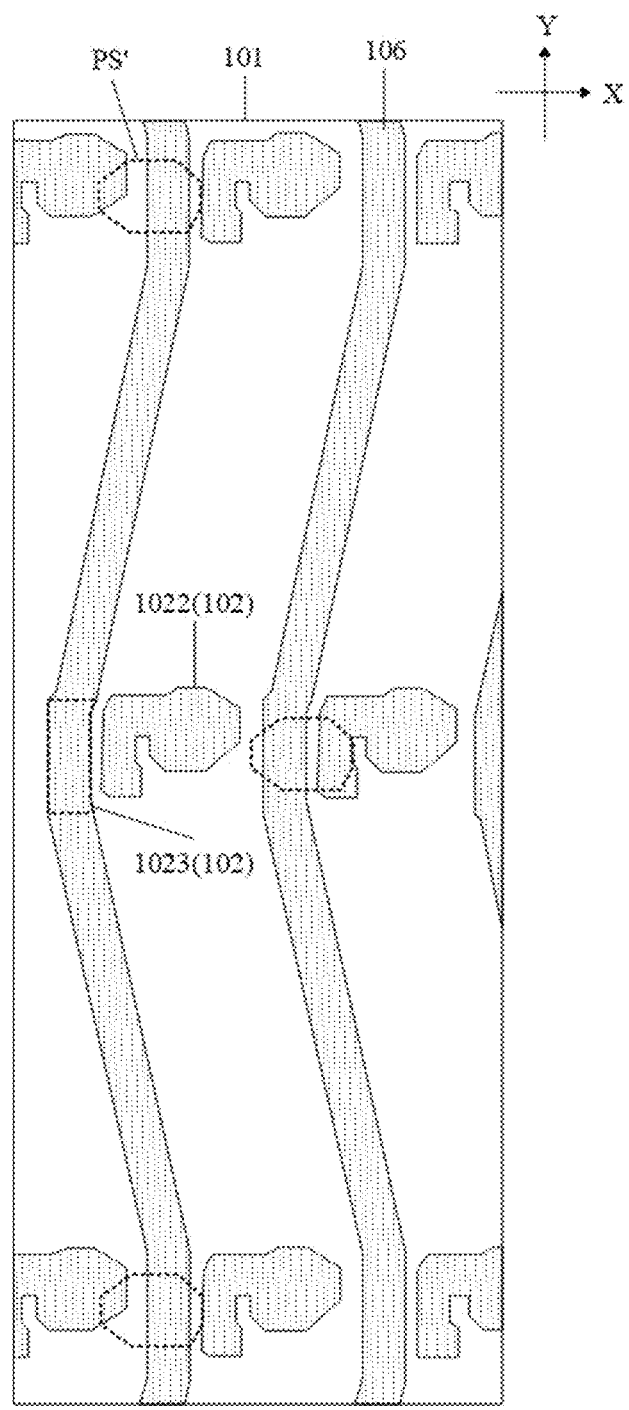
FIG. 8 is a schematic structural diagram of a layer where a data line is located in FIG. 2.
Figure 9:
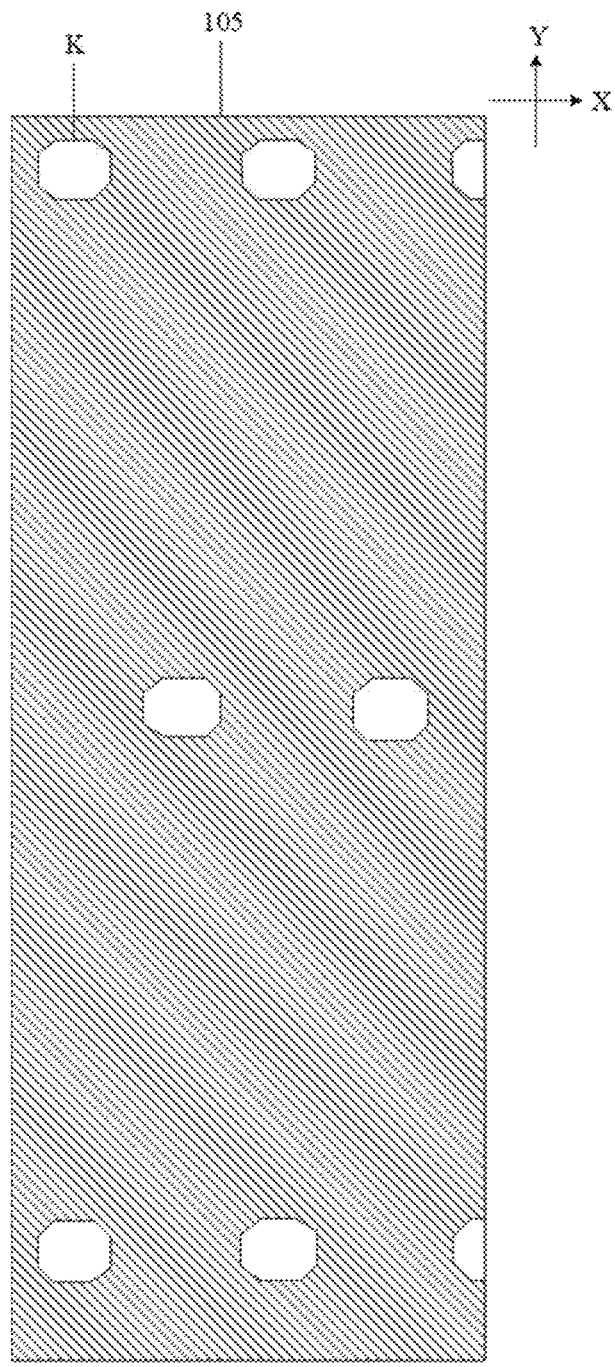
FIG. 9 is a schematic structural diagram of a layer where a common electrode is located in FIG. 2.
Figure 10:
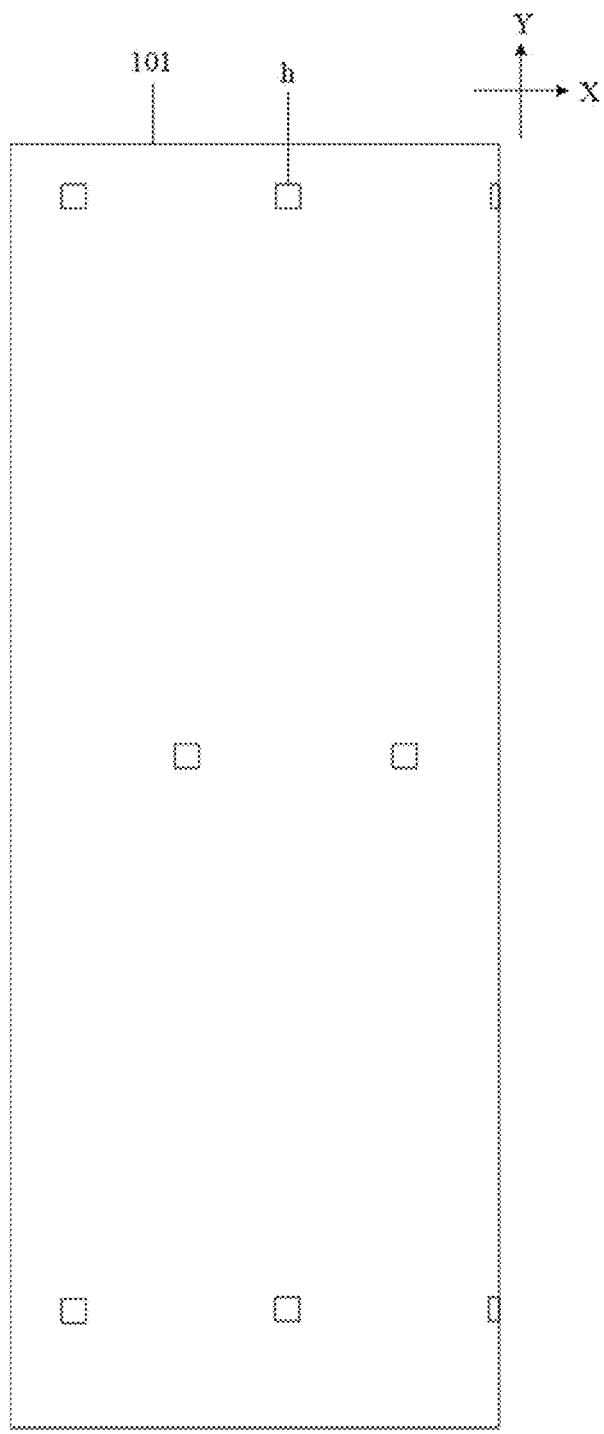
FIG. 10 is a schematic structural diagram of an insulating layer in FIG. 2.

Continuing to refer to FIG. 2 and FIG. 8, it can be seen that every two adjacent station regions PS' in the second direction Y are staggered in the first direction X, one of every two adjacent station regions PS' overlaps a region where the first electrode 1022 of the same transistor 102 is located and a region where a second electrode 1023 of the same transistor is located, and the other of every two adjacent station regions PS' overlaps a region where a second electrode 1023 of one transistor 102 is located and a region where the first electrode 1022 of the adjacent transistor 102 is located. By disposing that each station region PS' overlaps the region where the corresponding first electrode 1022 is located and the region where the corresponding second electrode 1023 is located, an area of the station region PS' is larger, which is conducive to stably supporting the photo-spacer (PS). Moreover, by disposing that every two adjacent station regions PS' in the second direction Y are staggered in the first direction X, which is equivalent to disposing every two adjacent rows of photo-spacers (PS) to be located in adjacent columns, the photo-spacers (PS) are arranged more uniformly, which is conducive to balancing the support force and maintaining the uniformity of the box thickness. At the same time, according to the present disclosure, this way of disposing the photo-spacers (PS) is applicable to high-definition (WQ) screens with a large resolution. Sub-pixels of the high-definition screens are smaller, if every two adjacent sub-pixels in the same row are provided with the photo-spacers (PS), the actually made adjacent photo-spacers (PS) will be connected together to affect the effects of supporting the box thickness, and therefore, only one of every two adjacent sub-pixels in the same row in the present disclosure is provided with the photo-spacer (PS). It should be understood that in low-resolution products, sub-pixels are large, there is a sufficiently large space for photo-spacers to be arranged to ensure that the photo-spacers (PS) at every two adjacent sub-pixels in the same row are actually made to be relatively independent and unconnected, and thus each sub-pixel may be provided with one photo-spacer (PS).

In some embodiments, in the above array substrate provided by embodiments of the present disclosure, as shown in FIG. 2, FIG. 8 and FIG. 11, the array substrate may further include a plurality of data lines 106 extending in inclination directions of the pixel electrodes 104 and arranged in the first direction X, for example, in a case that the pixel electrodes 104 include the first pixel electrodes 104' and the second pixel electrodes 104" in opposite inclination directions, the data lines 106 extend in the inclination directions of the first pixel electrode 104' and the inclination directions of the second pixel electrodes 104" to exhibit a folded line shape. Line widths of the data lines 106 in the present disclosure are substantially uniform (i.e., uniform or within a range of error ±5% due to factors such as fabrication, and measurement), and the data lines 106 may be locally multiplexed as the second electrodes 1023 of the transistors 102. The present disclosure utilizes the data lines 106 which are locally multiplexed as the second electrodes 1023, and the first electrodes 1022 of the transistors 102 to jointly support the photo-spacers (PS), which can ensure the effective support for the photo-spacers (PS). Moreover, considering that locally widened data lines 106 are used in the related art to support photo-spacers (PS), the data lines 106 in the present disclosure are better in uniformity of line widths, and have small influence on the aperture rate, and thus, the aperture rate can be increased while the photo-spacers (PS) are stably supported.

In some embodiments, in the above array substrate provided by embodiments of the present disclosure, as shown in FIG. 2, FIG. 6, FIG. 8 and FIG. 11, each transistor 102 is located one side of the corresponding gate line 103 facing the pixel electrode 104 to which the gate line 103 is coupled, a gate electrode 1021 of each transistor 102 is arranged integrally with the corresponding gate line 103, and the gate electrode 1021 of each transistor 102 is arranged at a corner (i.e., a corner close to the first electrode 1022) far away from the corresponding gate line 103 and the corresponding data line 106 in a notched manner (for example, each gate electrode 1021 is arranged at a top right corner shown in FIG. 6 in a notched manner), so that the occupied area of each gate electrode 1021 is reduced, and the aperture rate is increased.

In some embodiments, in the above array substrate provided by embodiments of the present disclosure, as seen in conjunction with FIG. 2 and FIG. 6 to FIG. 8, an orthographic projection of an active layer 1024 of each transistor 102 on the base substrate 101 is located within orthographic projections of the gate electrode 1021 of the transistor 102 and the corresponding gate line 103 on the base substrate 101, so that the gate electrode 1021 is used to shield the active layer 1024, so as to prevent backlight from illuminating the active layer 1024 and generating leakage currents. Accordingly, since each gate electrode 1021 is arranged near the corresponding first electrode 1022 in a notched manner, in the second direction Y, a bonding width $w_1$ of the active layer 1024 of each transistor and the second electrode 1023 of the transistor 102 may be larger than a bonding width $w_2$ of the active layer 1024 of the transistor 102 and the first electrode 1022 of the transistor 102, and the active layer 1024 of the transistor 102 is approximately inverted-T-shaped.

In some embodiments, in the above array substrate provided by embodiments of the present disclosure, as shown in FIG. 2, FIG. 8 and FIG. 11, an orthographic projection of one end of each convex portion 1044 far away from the corresponding second end portion 1042 on the base substrate 101 is located within an orthographic projection of the corresponding data line 106 on the base substrate 101. In other words, one end of each convex portion 1044 away from the corresponding second end portion 1042 does not exceed a region where the corresponding data line 106 is located, so that it may be ensured that a distance between the convex portion 1044 and the pixel electrode 104 adjacent thereto is at least equal to a spacing between the corresponding data line 106 and the pixel electrode 104 adjacent thereto, and a short circuit of each convex portion 1044 and the pixel electrode 104 adjacent thereto is effectively prevented.

Figure 12:
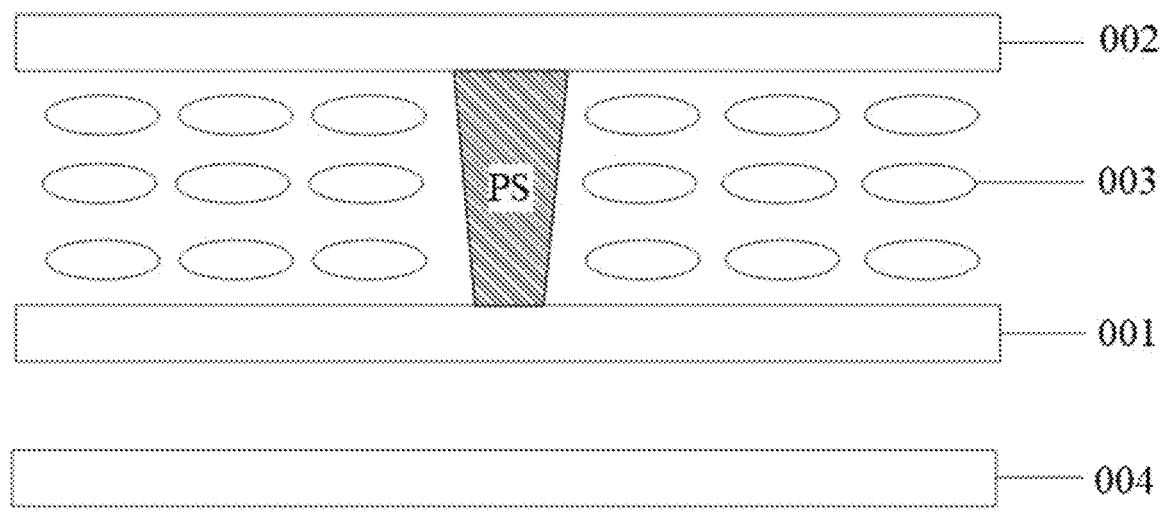
FIG. 12 is a schematic structural diagram of a display apparatus provided by an embodiment of the present disclosure.

Based on the same inventive concept, embodiments of the present disclosure provide a display apparatus, as shown in FIG. 12, including an array substrate 001 and an opposite substrate 002 which are arranged opposite to each other, and a liquid crystal layer 003 arranged between the array substrate 001 and the opposite substrate 002, where the array substrate 001 is the above array substrate provided by embodiments of the present disclosure. Since the principle for solving problems of the display apparatus is similar to that of the above array substrate, implementations of the display apparatus may refer to embodiments of the above array substrate, and repeated parts are omitted herein.

As seen in FIG. 2 and FIG. 12, the opposite substrate 002 provided by the present disclosure may include photo-spacers (PS), and orthographic projections of end portions of the photo-spacers (PS) close to the array substrate 001 on the base substrate 101 and orthographic projections of station regions PS' on the base substrate 101 substantially coincide (i.e., overlap or within a range of error due to factors such as fabrication, and measurement), so that the station regions PS' are prevented from being too large and affecting the aperture rate while the photo-spacers (PS) are stably supported.

In some embodiments, the above display apparatus provided by embodiments of the present disclosure, as shown in FIG. 12, may also include a backlight module 004 located on a light-entry side of the array substrate 001, and the backlight module 004 may be a direct-down type backlight module as shown in FIG. 12, or a side entry type backlight module. In some embodiments, the side entry type backlight module may include a light bar, stacked reflective sheets, a light guide plate, a diffusion sheet, a prism set, and the like, and the light bar is located on one side of a thickness direction of the light guide plate. The direct-down type backlight module may include a matrix light source, reflective sheets stacked on a light emitting side of the matrix light source, a diffusion plate, a brightness enhancement film and the like, and the reflective sheets include holes arranged directly opposite to positions of lamp beads in the matrix light source. Lamp beads in the light bar and the lamp beads in the matrix light source may be light-emitting diodes (LED), such as mini light-emitting diodes (Mini LED, Micro LED, etc.).

Mini light-emitting diodes on the sub-millimeter scale or even on the micrometer scale and organic light-emitting diodes (OLEDs) are self-light-emitting devices. Like organic light-emitting diodes, they have a series of advantages, such as high brightness, ultra-low latency, and large viewing angle. Moreover, since light emitting of inorganic light-emitting diodes is achieved based on metal semiconductors with more stable properties and lower resistance, compared with organic light-emitting diodes achieving light emitting based on organic substances, the inorganic light-emitting diodes have the advantages of being lower in power consumption, more resistant to high and low temperatures and longer in service life. When a mini light-emitting diode is used as a backlight source, a more precise dynamic backlight effect can be achieved, and while the brightness and contrast of a screen are effectively improved, the phenomenon of glare caused by traditional dynamic backlight between bright and dark regions of the screen can also be solved, and the visual experience is optimized.

In some embodiments, the above display apparatus provided by embodiments of the present disclosure may be: a projector, a 3D printer, a virtual reality device, a mobile phone, a tablet computer, a television, a display, a laptop, a digital photo frame, a navigator, a smart watch, a fitness wristband, a personal digital assistant, and any product or component with a display function. In some embodiments, the display apparatus provided by the present disclosure includes, but is not limited to: a radio frequency unit, a network module, an audio output & input unit, a sensor, a display unit, a user input unit, an interface unit, a control chip and other components. In some embodiments, the control chip is a central processor, a digital signal processor, a system-on-chip (SoC), and the like. For example, the control chip may also include a memory, and may also include a power supply module and the like, and the power supply as well as the signal input and output functions are realized through additionally arranged wires, signal lines, and the like. For example, the control chip may also include a hardware circuit, a computer-executable code, and the like. The hardware circuit may include a conventional very large scale integration (VLSI) circuit or a gate array as well as an existing semiconductor such as a logic chip and a transistor, or other discrete elements; and the hardware circuit may also include a field programmable gate array, a programmable array logic, a programmable logic device, and the like. In addition, those skilled in the art can understand that the above structure does not constitute a limitation of the above display apparatus provided by the embodiment of the present disclosure. In other words, the above display apparatus provided by the embodiment of the present disclosure may include more or less above components, or combines certain components, or different component arrangements.

Although preferred embodiments have been described in the present disclosure, it should be understood that those skilled in the art can make various modifications and variations on the embodiments of the present disclosure without departing from the spirit and scope of the embodiments of the present disclosure. Thus, provided that these modifications and variations of the embodiments of the present disclosure fall within the scope of the claims of the present disclosure and their equivalent technologies, the present disclosure is also intended to cover such modifications and variations.

What is claimed is:

1. An array substrate, comprising:
a base substrate;
a plurality of pixel circuits, arranged in an array on the base substrate;
a plurality of gate lines, extending in a first direction and arranged in a second direction on the base substrate, wherein the plurality of gate lines are coupled with the plurality of pixel circuits; and
a plurality of pixel electrodes, arranged in an array on the base substrate, wherein each pixel electrode comprises a first end portion and a second end portion arranged opposite to each other, a plurality of intermediate portions connecting the first end portion and the second end portion, and a convex portion located on one side of the second end portion, the first end portion is coupled with the pixel circuit, the intermediate portions extend obliquely relative to both the first direction and the second direction, the convex portion extends in a direction at an obtuse angle to an extending direction of the intermediate portions, a slit between adjacent intermediate portions is a parallelogram, and an orthographic projection of the slit on the base substrate does not overlap with an orthographic projection of the pixel circuit on the base substrate and an orthographic projection of the gate line on the base substrate;
wherein the pixel circuit comprises a transistor, the transistor comprises a station region for supporting a photo-spacer, and an orthographic projection of the convex portion on the base substrate and an orthographic projection of the station region on the base substrate do not overlap with each other;
wherein a first electrode of the transistor is coupled with the pixel electrode, two adjacent station regions in the second direction are staggered in the first direction, one of the two adjacent station regions overlaps with a region where the first electrode of the same transistor is located and a region where a second electrode of the same transistor is located, and the other of the two adjacent station regions overlaps with a region where a second electrode of one transistor is located and a region where the first electrode of a transistor adjacent with the one transistor is located.

2. The array substrate according to claim 1, wherein an orthographic projection of the convex portion on the base substrate approximates a triangle in shape, the triangle comprises an arc angle far away from the second end portion, and an included angle of boundary extension lines of the arc angle is greater than or equal to 20° and less than or equal to 30°.

3. The array substrate according to claim 1, wherein an extending direction of the convex portion rotates the obtuse angle with respect to the extending direction of the intermediate portions; and the extending direction of the convex portion and the extending direction of the intermediate portions rotate in the same direction with respect to the first direction.

4. The array substrate according to claim 1, wherein the orthographic projection of the convex portion on the base substrate is located within the orthographic projection of the gate line on the base substrate.

5. The array substrate according to claim 1, further comprising: a plurality of data lines extending in inclination directions of the pixel electrodes and arranged in the first direction, line widths of the data lines are substantially uniform, and the data line is locally multiplexed as the second electrode of the transistor.

6. The array substrate according to claim 5, wherein the transistor is located on one side of the gate line facing the pixel electrode with which the gate line is coupled, a gate electrode of the transistor is arranged integrally with the gate line, and the gate electrode of the transistor is arranged at a corner far away from the gate line and the data line in a notched manner.

7. The array substrate according to claim 6, wherein an orthographic projection of an active layer of the transistor on the base substrate is located within orthographic projections of the gate electrode of the transistor and the gate line on the base substrate; and in the second direction, a bonding width between the active layer of the transistor and the second electrode of the transistor is greater than a bonding width between the active layer of the transistor and the first electrode of the transistor.

8. The array substrate according to claim 5, wherein an orthographic projection of one end of the convex portion far away from the second end portion on the base substrate is located within an orthographic projection of the data line on the base substrate.

9. The array substrate according to claim 1, wherein the plurality of pixel electrodes comprise a plurality of first pixel electrodes and a plurality of second pixel electrodes, rows where the first pixel electrodes are located and rows where the second pixel electrodes are located are alternately arranged in the second direction, and inclination directions of the intermediate portions of the first pixel electrodes and inclination directions of the intermediate portions of the second pixel electrodes are substantially symmetrical about the first direction.

10. A display apparatus, comprising an array substrate and an opposite substrate which are arranged opposite to each other, and a liquid crystal layer arranged between the array substrate and the opposite substrate, wherein the array substrate is the array substrate according to claim 1.

11. The display apparatus according to claim 10, wherein pixel circuits comprise transistors, the transistors comprise station regions for supporting photo-spacers, the opposite substrate comprises the photo-spacers, and orthographic projections of end portions of the photo-spacers close to the array substrate on the base substrate and orthographic projections of the station regions on the base substrate substantially coincide.

12. The display apparatus according to claim 10, wherein an orthographic projection of the convex portion on the base substrate approximates a triangle in shape, the triangle comprises an arc angle far away from the second end portion, and an included angle of boundary extension lines of the arc angle is greater than or equal to 20° and less than or equal to 30°.

13. The display apparatus according to claim 10, wherein an extending direction of the convex portion rotates the obtuse angle with respect to the extending direction of the intermediate portions; and the extending direction of the convex portion and the extending direction of the intermediate portions rotate in the same direction with respect to the first direction.

14. The display apparatus according to claim 10, wherein the orthographic projection of the convex portion on the base substrate is located within the orthographic projection of the gate line on the base substrate.

15. The display apparatus according to claim 10, further comprising: a plurality of data lines extending in inclination directions of the pixel electrodes and arranged in the first direction, line widths of the data lines are substantially uniform, and the data line is locally multiplexed as the second electrode of the transistor.

16. The display apparatus according to claim 15, wherein the transistor is located on one side of the gate line facing the pixel electrode with which the gate line is coupled, a gate electrode of the transistor is arranged integrally with the gate line, and the gate electrode of the transistor is arranged at a corner far away from the gate line and the data line in a notched manner.

* * * * *